United States Patent
Borremans

(10) Patent No.: US 7,542,739 B2
(45) Date of Patent: Jun. 2, 2009

(54) UP CONVERTER MIXER LINEARIZATION IMPROVEMENT

(75) Inventor: Marc Borremans, Korbeek-Dijle (BE)

(73) Assignee: STMicroelectronics Belgium N.V., Zaventem (BE)

( * ) Notice: Subject to any disclaimer, the term of this patent is extended or adjusted under 35 U.S.C. 154(b) by 1267 days.

(21) Appl. No.: 10/826,874

(22) Filed: Apr. 16, 2004

(65) Prior Publication Data
US 2004/0224658 A1    Nov. 11, 2004

(30) Foreign Application Priority Data
Apr. 17, 2003    (EP) .................... 03076146

(51) Int. Cl.
*H04B 1/04*    (2006.01)
(52) U.S. Cl. ............. 455/118; 455/127.1; 455/130
(58) Field of Classification Search ............. 455/118, 455/127.1, 127.2, 130, 131, 138–141, 232.1, 455/269
See application file for complete search history.

(56) References Cited
U.S. PATENT DOCUMENTS 5,379,456 A *  1/1995  Papadopoulos ............. 455/318
6,347,221 B1   2/2002  Tsukahara et al.
6,961,546 B1 * 11/2005  Rofougaran et al. ......... 455/118
7,082,293 B1 *  7/2006  Rofougaran et al. ......... 455/260

FOREIGN PATENT DOCUMENTS
EP    0 961 398 A    12/1999

OTHER PUBLICATIONS

European Search Report from European patent application No. 03076146.3, filed Apr. 17, 2003
European Search Report from a corresponding European patent application No. 04 44 7099, search completed Jun. 22, 2004.

* cited by examiner

*Primary Examiner*—Tony T Nguyen
(74) *Attorney, Agent, or Firm*—Lisa K. Jorgenson; James H. Morris; Wolf, Greenfield & Sacks, P.C.

(57) ABSTRACT

An up conversion mixer has a Gilbert cell arrangement including an input amplification part for producing an amplified signal coupled to a multiplication part, the multiplication part being arranged to multiply the amplified signal by a local oscillator signal and output a mixed signal, the mixer also having a capacitor coupled from a node between the input amplification part and the multiplication part, to a power supply line, for suppressing unwanted high frequency signal components of the output signal of the multiplication part. The linearity of such mixers can be improved considerably by this impedance on the source node of the switch transistors. This capacitance can be placed to either VSS or to VDD. Notably this improvement can be achieved with low power consumption since no additional power is needed for the increased performance.

20 Claims, 5 Drawing Sheets

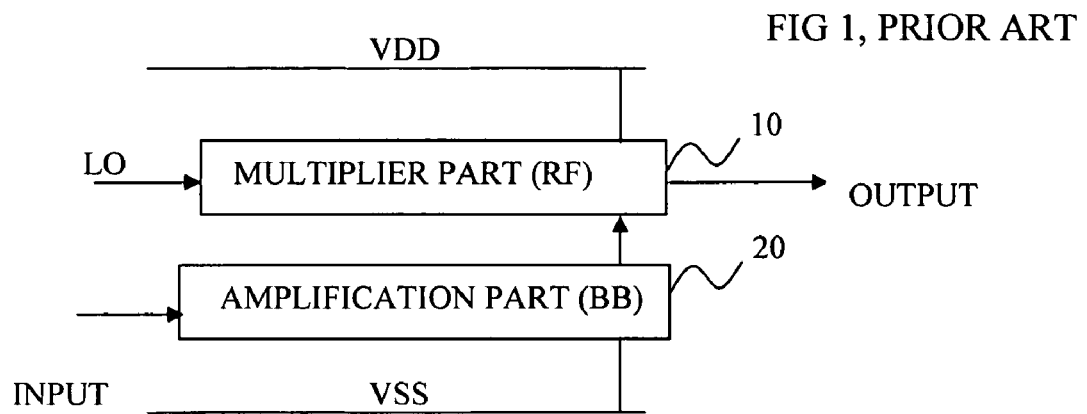
FIG 1, PRIOR ART
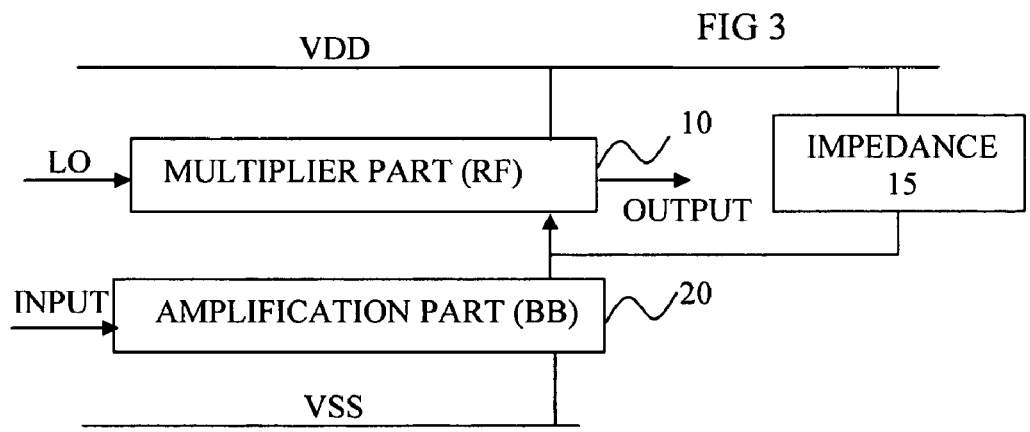
FIG 3
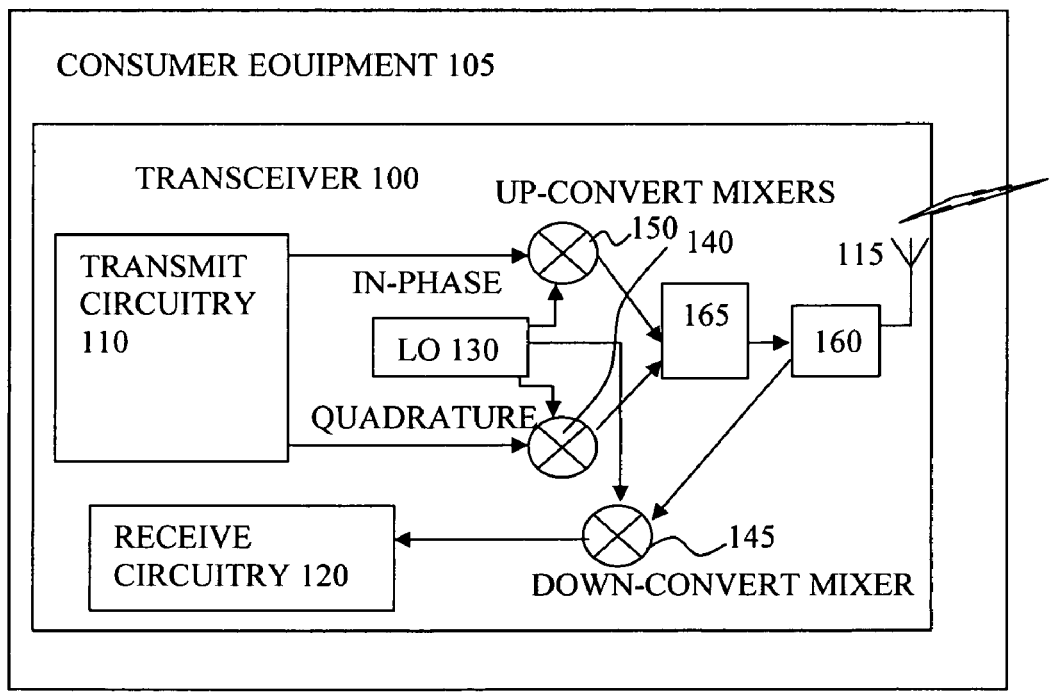
FIG 5

UP CONVERTER MIXER LINEARIZATION IMPROVEMENT

BACKGROUND OF THE INVENTION

1. Field of the Invention

This invention relates to up conversion mixers as used in transmitters, to methods of producing mixed signals, and to mixed signals produced by such apparatus or methods.

2. Discussion of the Related Art

A mixer performs a multiplication of two input signals (A at frequency $f_A$ and B at $f_B$) resulting in an output signal C at $f_A+/-f_B$. Depending on the frequency nature of the input and output signals, up-conversion and down-conversion mixers can be distinguished. In a down-conversion structure two high frequency signals (Local Oscillator LO and Radio Frequency RF) are the input signals resulting in a low frequency (Intermediate Frequency IF or Low Frequency LF) output. This is used in receiver structures. In an up-conversion mixer, as used in transmitters, the output is the high frequency RF signal and the low frequency LF is an input. The up-conversion of the baseband signal has to be performed linearly. A non-linear conversion will result in unwanted frequency spurs and spectral regrowth. A notable indication of linearity is the level of unwanted third order baseband products (LO.3BB) produced by the mixer from multitone inputs.

When the linearity of a transmitter is discussed, two different aspects have to be considered. A first aspect is the "in-band linearity". When a local oscillator signal is mixed with a single-tone baseband (BB) signal, this results in a mixing product LO.BB with frequency components at $f\{LO\}+/-f\{BB\}$. However, because of the non-linearity of the mixers and/or because of intermodulation products, also components at $f\{LO\}+/-x.f\{BB\}$ are formed. This non-linearity is very important because these unwanted mixing components can not be filtered out.

When a spectrum is applied instead of a single tone, this kind of non-linearity causes regrowth of the spectrum which can cause a serious bit-error-rate degradation in the adjacent channels at the receiver side. The relation between the single tone behaviour and the spectral regrowth is dependent on the input signal modulation type and can be mathematically calculated.

A second important linearity specification is the "harmonic distortion around multiples of the LO frequency". These components can be filtered out after a single-channel transmitter, and so are less of a concern for the present purposes.

Prior art solutions include similar structures for up- and down-conversion mixers based on variants on the classical (bipolar) Gilbert cell topology. The mixer implementations are not intrinsically linear. It is useful to distinguish between two stages, the first being generating the linear baseband current and the second being frequency translation of this input signal to RF. FIG. 1 shows an example of the known Gilbert cell having baseband and the RF functional subcircuits (10, 20). These are coupled in series in a path between a pair of power supply lines. The issue of linearity of the baseband current is essentially a basic low frequency analog issue, and can be dealt with in various ways by experienced analog designers, following established practice. Many variants (e.g. two stage arrangements) exist for the baseband part. The Gilbert cell topology was developed for bipolar implementation. More recently CMOS versions have been implemented. For these, proper switching of the modulating transistors requires a large LO voltage swing. Considering the limited frequency ability of the technology, this large high frequency (GHz range) LO signal conflicts with power consumption requirements.

The result of this is that the output signal's linearity is limited. When applying a sinewave baseband input, this non-linearity is seen as spurious components at f(LO)+/-#.f(BB). The linearity specification can be improved by reducing the baseband input signal amplitude, but this is not favorable from power consumption point of view: reducing the baseband signal will proportionally reduce the amount of RF output signal and amplifying a GHz signal linearly is very power-hungry. Therefore there is a need for a solution having good linearity in case of large baseband input values and/or relatively small LO signals. Existing linearization techniques like resistive degeneration intend to provide a linear baseband current to the modulating element. However even with an ideally linear baseband input, harmonic components of the baseband signal will appear in the output spectrum.

An example of a CMOS Gilbert cell with resistive degeneration is shown in U.S. Pat. No. 6,433,647. A low-noise quadrature phase I-Q modulator has a pair of Gilbert cell input stages. The degenerative resistor is located between the source terminals of the two transistors of the baseband part of the cell.

U.S. Pat. No. 5,095,290 discloses a modulator that uses negative feedback to improve the linearity of a Gilbert Cell. As with other types of balanced mixers, a Gilbert Cell lacks an output signal which is suitable for developing an appropriate feedback signal. The '290 patent overcomes this problem by using a first and a second Gilbert Cell. A first half of each Gilbert Cell is used to provide the modulated output signal, and a second half of each Gilbert Cell is used to reconstruct the modulating signal from a temporally sliced signal that is generated by each Gilbert Cell. The first Gilbert Cell provides a temporally sliced waveform that is complimentary to the temporally sliced waveform provided by the second Gilbert Cell. When these two temporally sliced waveforms are combined, they produce a usable modulator feedback signal. However, although the temporally-sliced waveforms should theoretically fit together in a complementary manner, in practice this requires a very high degree of matching between the active devices utilized in the Gilbert Cells.

Another example of a CMOS Gilbert cell arrangement is shown in U.S. Pat. No. 6,242,963 relating to a differential mixer with improved linearity. This explains that two types of loads have commonly been used for mixers based on Gilbert cells: resistive loads and MOSFET loads. In systems based on resistive loads, generally the gain of the mixer can only be increased by increasing the value of the resistors. Resistors with large values have higher parasitic capacitance associated with them and therefore can dramatically reduce the mixer speed and bandwidth. At the same time, large resistive loads combined with the relatively high bias currents required for high-speed operation can cause problems in the biasing of the Gilbert cell transistors and thereby effectively impose practical limits on the signal swing of the mixer output. Furthermore, the size of the resistive load may vary due to process variations by 30-40%, a variation that can change the gain substantially. In systems based on MOSFET loads, many of the difficulties associated with resistive loads no longer constrain the design. However, the nonlinear voltage-current characteristics of MOSFETs can create signal harmonics at the output nodes so that the output of the mixer is degraded. Accordingly, the patent suggests using a load containing transistors that are configured as a diode and a triode, where these circuits are additively combined to achieve substantially linear voltage-current characteristics over a predetermined range. By using substantially linear loads instead of conventional single-transistor loads, the linearity of the mixer can be improved. This effectively shows how a current generated in the mixer can be converted linearly into a voltage. However this does not help if the current generated is non linear, as the linear current to voltage conversion will not improve the linearity of the generated current.

In U.S. Pat. No. 6,404,263, there is a bipolar transistor Gilbert mixer for a wireless communications system having a differential amplifier (baseband part) that translates an input intermediate frequency voltage signal or an input radio frequency voltage signal to current signals that are supplied to a doubly-balanced switching modulator (RF part). This develops a differential mixed output radio frequency signal or intermediate frequency signal that is the product of the current signals and a local oscillator signal. Included at the output of the differential amplifier are reactance circuits or capacitors each of which provides a low impedance to ground at the second harmonic of the local oscillator signal and a high impedance at the frequency of the input radio frequency signal or input intermediate frequency signal. This counteracts the possibility of high second harmonic contents in the emitters of the transistors of the RF part when the input level of the local oscillator signal is high. The second harmonic is of concern if it has the greatest magnitude when compared to the other harmonics, in degrading the conversion gain and degrading the linearity of the mixer. However such harmonics of the LO are out of band and so can be countered by filtering. In many cases other components are more important to the overall linearity. The problem originates from the fact that with high LO input, significant even harmonics (mainly 2nd) are common mode at the LO base input. This common-mode input will reflect in this same frequency component at the emitter of the LO transistor. In this way, the effective voltage between base and emitter is reduced resulting in a reduced switching. This is solved by filtering the 2*f(LO) component. A resonance circuit that delivers a low impedance at 2LO. This only covers a small frequency band (e.g. not around 3LO). Only the 2LO component is trageted, as this is sufficient for this problem.

U.S. Patent Application 20010021645 shows a CMOS implemented Gilbert cell for a down-conversion mixer. A source of each of the differential pairs of the RF part and a source of the differential amplifier of the baseband is coupled to ground through an impedance circuit. This has high impedance for operational frequency of the circuit and short-circuited for D.C. current. This allows a bias potential to a gate of a transistor of a differential pair to be independent of a bias potential of a gate of a transistor of a differential amplifier. An independent bias potential allows a differential pair and a differential amplifier to have optimized bias potential so that a phase error of an output IF signal can be minimized. The document also shows a load (ZL1) coupled from the drain terminals of the transistors of the baseband part to the power supply potential $V_{DD}$. This is apparently a consequence of providing independent biasing. As the circuit is for a down conversion mixer, the load would need to be other than capacitive, for the circuit to work. There is no suggestion that this load can be used for other purposes.

SUMMARY OF THE INVENTION

An aim of the invention is to improve on such known arrangements and methods of operating the same.

According to one aspect, the invention provides an up-conversion mixer, having an input amplification part (BB) for producing an amplified signal coupled to a multiplication part (RF), the multiplication part being arranged to multiply the amplified signal by a local oscillator carrier signal (LO) and output a mixed signal, and means for suppressing coupled from a node between the input amplification part and the multiplication part, to a power supply line, the effect of the suppressing means being to suppress high frequency in band signal components of the output signal of the multiplication part. The unwanted high-frequency in band output signal components are products of the carrier signal with harmonics of the baseband signal. The means for suppressing suppresses the high frequency signals (preferably all high frequency components, e.g. both the in-band and importantantly the out-of-band components) at the circuit node where the means are connected to, and by this suppression at this node, the high frequency inband frequency spurs at the output node of the multiplication part are supressed.

The suppression means preferably comprises one or more circuit elements, e.g. an impedance element, coupled from a node between the input amplification part and the multiplication part, to a power supply line, for suppressing the high frequency in band signal components of the output signal of the multiplication part.

The in-band linearity of such mixers can be improved considerably by adding this impedance on the source node of the switch transistors. In this way, the more troublesome of the high frequency signal components are suppressed in the output signal. Particularly the inband RF current is linearized. In addition, the present invention includes suppression of higher order out of band harmonics at the node which contribute to the mixer non-linearity. It addresses the problem of the current generated by the amplification part being not linear, and improves this intrinsic linearity, in contrast to prior art proposals such as U.S. Pat. No. 6,242,963 mentioned above. Simulations and measurements have shown that an order of magnitude improvement of the linearity ($@f_{LO}+3f_{BB}$ for example) can be achieved by adding such an impedance in the form of extra capacitance on the source node. For applications in balanced IQ mixers of classical design, this is usually the dominant spurious component. This capacitance can be placed to either VSS or to VDD, or to ground. It can be applied to circuits having any baseband circuit, as the improvement is concerned with the RF modulation part. It is applicable to any type of output load, since the generated current is intrinsically linearized.

Notably this improvement of the RF linearity, can be achieved with low power consumption (since no additional power is needed for the increased performance, or the same performance as before can be achieved with smaller power consumption for example).

As a preferred additional feature, the impedance is a capacitor. The value of the capacitor can be determined using conventional techniques such as simulation, to see the amount of suppression of unwanted components such as the LO3BB component. In a typical application the capacitance could be in the range 0.2 to 5 pF, in particular 0.5-2.0 pF.

As a preferred additional feature, the RF switching part comprises MOS transistors. These are preferred for low power, low driving voltage and for convenience of integration. Due to the non-ideal switching of the transistors and the intrinsic behavior of the MOS transistors, this node's voltage frequency components largely determine the mixer current frequency components. In other words, the switches are not longer simply considered as switches but as MOS transistors with their non-linear behavior and the inputs are optimized in order to achieve optimal power consumption and linearity specifications.

As a preferred additional feature, the multiplier part is arranged in a balanced differential form.

Another preferred additional feature is the mixer being arranged as a Gilbert cell. This is a commonly used arrangement, which is double-balanced. A long-tail differential pair amplifies the BB input to the mixer. The differential output of this amplifier is switched by the local oscillator signal alternately to each of the differential RF outputs. This essentially achieves a multiplication of the BB by +/−1 at the LO frequency. Other arrangements than Gilbert cells are conceivable, and there are numerous variants of the cell, to which the invention is applicable.

As a preferred additional feature, the impedance is coupled to the VDD power supply line.

As a preferred additional feature, the MOS transistors are nMOS transistors. Placing the impedance to the VDD line has the additional advantage that the RF currents which go though the switches and the impedance only flow around in a small local loop and therefore will couple less to other sub-circuits of the system. Therefore, this reduces the risk of coupling of e.g. the current at frequency 2RF to other parts of the system that have the same common VSS. Connection to the other VSS/VDD net still results in the same linearity and power consumption advantages.

As a preferred additional feature, the impedance is coupled to the VSS power line and the MOS transistors are pMOS transistors. This has corresponding advantages to the nMOS example above.

As a preferred additional feature, the mixer has phase compensation for mirror suppression. The combination of the impedance and phase compensation can bring improved mirror suppression performance. This solution can reduce certain intermodulation products that also fall on the mirror frequency. E.g. by filtering the 2*f(LO)+1 f(BB) voltage component on the capacitor node, the mixing product with LO (at LO+BB) can be reduced. A possible implementation for calibration of the image component involves giving a phase shift between the baseband I and Q signals. This phase shift compensates for both amplitude and phase errors in the LO and BB I and Q signal paths. If the theoretically required values are used for the amount of phase offset on the baseband signal, a considerable image component remains in practice. This is caused by the combination of the intrinsic non-linearity of the mixer and the phase offset on the baseband signal. This unwanted image component can be reduced by using the additional impedance of the invention set out above, since the non linear components at the image frequency are strongly reduced.

As a preferred additional feature, the mixer is in the form of an integrated circuit.

As a further aspect of the invention, there is provided a radio transceiver having the mixer set out above.

As a preferred additional feature, the transceiver comprises a mixer for an inphase signal, and a mixer for a quadrature phase.

Other aspects of the invention include methods of producing up converted signals using the mixer set out above, and the mixed signals themselves. In particular the present invention provides a method of producing up converted signals using a mixer, the mixer comprising a node between an input amplification part and a multiplication part of the mixer, the method comprising: amplifying an input signal to the mixer, multiplying the amplified signal by a local oscillator carrier signal (LO), and outputting a mixed signal, and suppressing one or more unwanted high frequency signal components of an output signal of the multiplication part. The unwanted high frequency in band output signal components are products of the carrier signal with harmonics of the baseband signal.

Other advantages will be apparent to those skilled in the art. The additional features can be combined together in any way or combined with any aspect of the invention as would be apparent to those skilled in the art. How the present invention may be put into effect will now be described with reference to the appended schematic drawings. Obviously, numerous variations and modifications can be made without departing from the scope of the claims of the present invention. Therefore, it should be clearly understood that the form of the present invention is illustrative only and is not intended to limit the scope of the present invention.

BRIEF DESCRIPTION OF THE DRAWINGS

The features of the invention will be better understood by reference to the accompanying drawings, which illustrate embodiments of the invention. In the drawings:

FIGS. 1 and 2 show prior art mixers,

FIGS. 3 and 4 show up converter mixers according to embodiments of the invention, and FIG. 5 shows a transceiver to which the mixers can be applied according to embodiments of the present invention.

DETAILED DESCRIPTION

Figure 2:
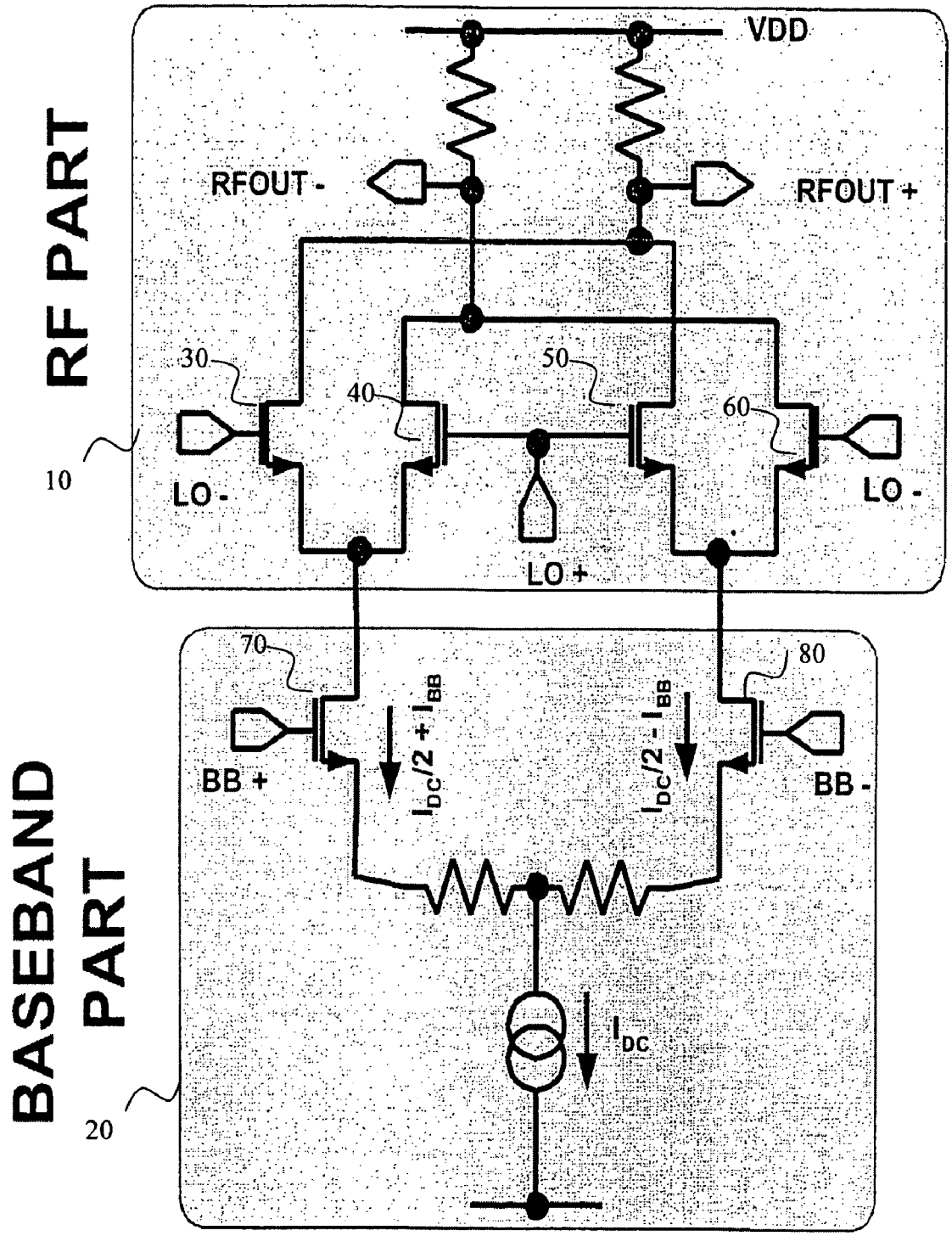

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, any such terms as top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

FIG. 1 shows a known mixer having a multiplier part (RF), 10 coupled to an input amplifier part (BB) 20. For the example of an up converter, the amplifier is in the form of a baseband part which receives a baseband signal containing the information to be modulated onto an output RF signal. The baseband part generates a baseband current $I_{BB}$. This is fed to the multiplier part (RF) which receives a local oscillator signal and generates an RF output modulated by the baseband signal.

FIG. 2 shows an example of a known Gilbert cell arrangement for implementing the mixer of FIG. 1. The RF part includes a first pair of transistors 30, 40 whose first main electrodes, e.g. source terminals are coupled together and coupled to one of the two balanced outputs of the baseband part. A balanced local oscillator signal drives the gates of the first pair of transistors. A second pair of transistors 50, 60 is coupled to be driven by the other balanced input from the baseband part. Again, the first main electrodes, e.g. source terminals of these transistors are coupled together. The other main electrodes, e.g. drain terminals of transistors 40 and 60 are coupled to power supply line VDD through a load. The load can be of any type, a resistor is shown as an example. The other main electrodes, e.g. the drain terminals of transistors 30 and 50 are coupled together and coupled to the same power line through another load such as a resistor. The differential output of this amplifier is switched by the local oscillator signal alternately to each of the differential RF outputs. This essentially achieves a multiplication of the BB by +/−1 at the LO frequency.

The baseband part can be implemented in various ways. In the example shown, the baseband input is a balanced signal driving the gates of a pair of transistors 70, 80. These form a long-tail differential pair for amplifying the RF input to the mixer. The source terminals are coupled together through resistors, to a current source $I_{DC}$, which provides a biased current. The RF output is taken from the drain terminals of the RF part transistors.

The present invention is based on the finding that in bipolar technology only a small voltage amplitude is required at the base of a modulating transistor to make it switch because of the exponential I-V (Current-Voltage characteristic) whereas different problems have been found for MOS circuits. In MOS technology, e.g. CMOS devices, a much higher voltage is required to make the transistor switch. In implementations of a mixer in accordance with the present invention this switching happens at a high frequency, e.g. for Bluetooth at 2.4 billion times per second (2.4 GHz), for GSM 0.9 GHZ. It is difficult and power consuming to make a high signal amplitude at this high frequency. Accordingly, a MOS modulator behaves very differently from a bipolar modulator (different input amplitude-too small to have a good switching and different-non-exponential I-V characteristic).

Figure 6:
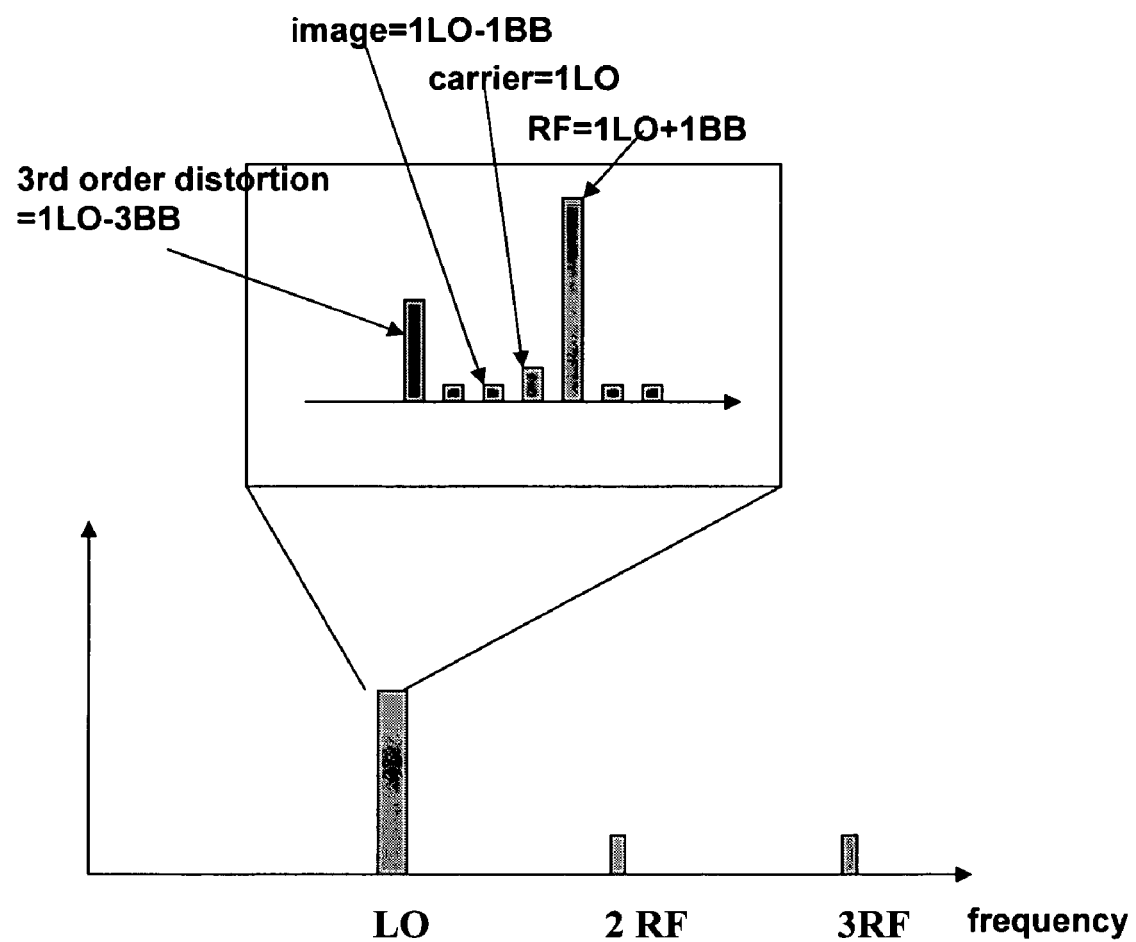
FIG. 6 shows frequency components at the output node of the multiplication part of an upconverter in accordance with embodiments of the present invention, especially $3^{rd}$ order distortions which are to be suppressed.
Figure 7:
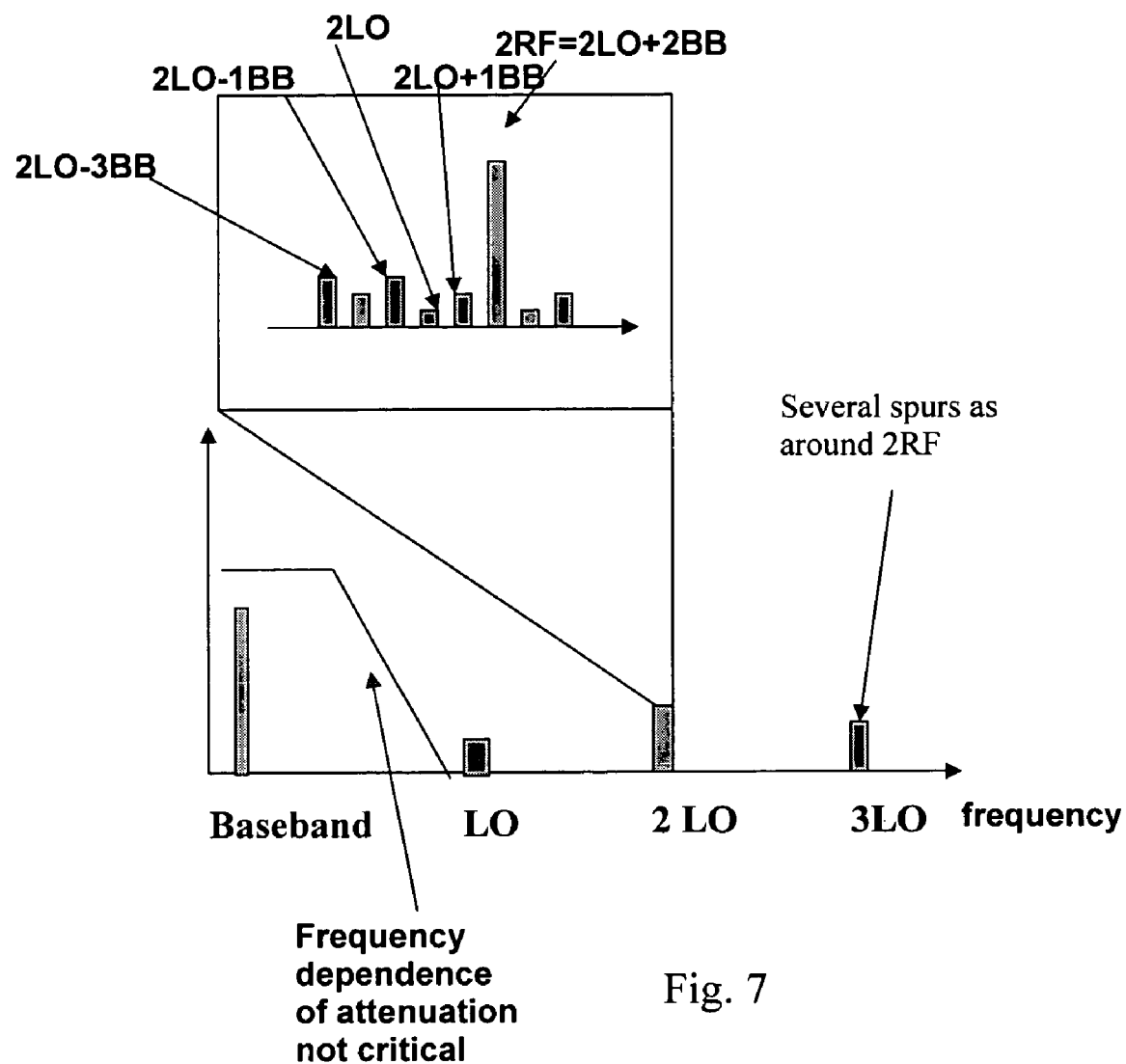
FIG. 7 shows frequency components at a node between the baseband and multiplication parts of an upconverter in accordance with embodiments of the present invention, especially those components which when suppressed will suppress $3^{rd}$ order distortions at the output of the multiplication part.

A problem addressed by the present invention is the improvement of the linearity of the modulation process. The MOS transistors have been simulated not as switching elements but by taking into account there true (non-linear) characteristics which can generate distortions in the output signal (see FIG. 6). It is the output spectrum sjown schematically in FIG. 6 that is indirectly affected by suppressing frequency components (see FIG. 7) at the node between the baseband and multiplication parts of an upconverter in accordance with the present invention. The distortions in the output signal are mainly the 3rd order distortion component as shown in FIG. 6. The filtering action is not on the output directly but on the node. The filtering action is not on the 3rd order distortion component of the output itself. The filtering action is on the low impedance node and is on the signals around 2LO and around 3LO there (see FIG. 7).

The present invention deals with the high frequency signals generated by the modulating transistor itself. In accordance with aspects of the present invention components at x.f(LO)+ y.f(BB) are suppressed (x can have values of 2 or 3 or 4 or 5 or more, etc.; y can have values of 0 or 1, or 2 or 3 or 4 or 5, or more etc.) at the first main electrode of the MOS modulating transistor (see FIG. 7), i.e. the source node of the modulating transistor in the embodiments described. This adaptation results in a strong reduction of the 1.f(LO)+/−3f(BB) component at the output of the MOS circuit (see FIG. 6), i.e. at the other one of the main electrodes of the modulating transistor, e.g. in the embodiments described this is at the drain of the modulating transistor.

In the present invention a suppressor impedance, e.g. a capacitor or a suppressor circuit, is used to suppress e.g. 2.f(LO)+/−3f(BB) or 2.f(LO)+/−1f(BB) at the source of the modulating transistor. Otherwise these high frequency components are creating in the modulation process a component at f(LO)−3f(BB) at the output of the up converter. For example, with an FSK modulated system like Bluetooth (or GSM), the carrier is e.g. at 2402 MHz, and with a 150 kHz BB signal continuously transmitting a digital "1" signal, the RF signal is at 2402.150 MHz and the component to be suppressed at the output in accordance with the present invention is f(LO)−3f(BB) or 2401.550 MHz. There is a difference in frequency between this frequency and the carrier frequency which is small but suppression is advantageous in a GFSK modulation with a difference between the RF signal, the carrier, the image and intermodulation products.

The higher harmonics are filtered by the suppressor impedance of the present invention with the result that an f(LO)−3f(BB) component is suppressed at the output. The suppressor impedance circuit (e.g. capacitor) is required even with ideal sinusoidal LO inputs without harmonic components. It is the components around 2LO rather than 2LO e.g. 2LO+/−1BB or 2LO+/−3BB) and around 3LO created by the non-linearity of the MOS modulating transistor itself that need to be reduced by the choice of the (low) impedance of the supressor circuit at these frequencies. Filter frequency to be suppressed at the node is not critical as long as the baseband signal is not suppressed and components around 2RF and around 3 RF are suppressed—see FIGS. 6 and 7. FIG. 3 shows a mixer circuit according to a first embodiment of the invention. This corresponds to FIG. 1, and the same reference numerals have been used where appropriate. Notably, a suppression circuit, e.g. an impedance 15, has been added between the point (node) joining the RF part and the baseband part and a power supply rail.

The suppression circuit has an impedance and may be in the form of a capacitor or one or more other circuit elements to achieve a suppression of unwanted high frequency signal components at the output of the multiplication part. The impedance is dimensioned so that unwanted high frequency signal components are suppressed in the output signal. In particular, in-band RF current is linearized. As indicated above the present invention includes suppression of higher order out of band harmonics at the node which contribute to mixer non-linearity. The value of a suitable capacitor can be determined using conventional techniques such as simulation, to see the amount of suppression of unwanted signal components such as the LO3BB component. In a typical application the capacitance could be in the range 0.2 to 5 pF, especially 0.5-2.0 pF. Simulations and measurements have shown that an order of magnitude improvement of the linearity (at $f_{LO}+3f_{BB}$ for example) can be achieved by adding such an impedance in the form of extra capacitance on the source node. The impedance can be coupled either to the VSS or the VDD power supply line. For a mixer implemented in nMOS, by coupling the impedance VDD power supply line there is an additional advantage that RF currents passing through the switches and the impedance only flow in a small local loop, and are less likely to couple to other subcircuits of the system. Correspondingly, for a pMOS implemented mixer, it is preferable to couple the impedance to the VSS power supply line. The effect on linearity of the mixer should be similar regardless of which power supply line is used.

Figure 4:
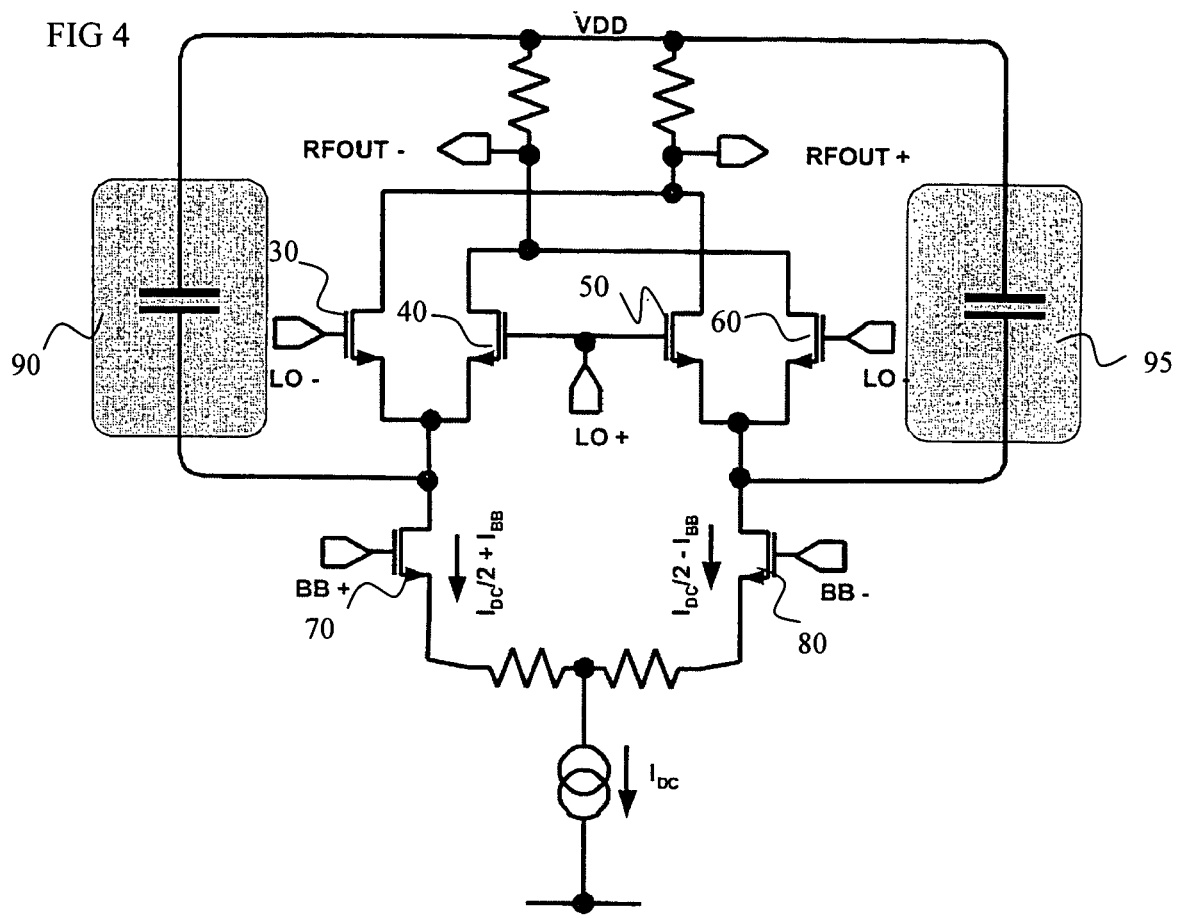

FIG. 4 shows an embodiment of a mixer corresponding to the embodiment of FIG. 2, but with the addition of two or more impedances, e.g. in the form of capacitors 90, 95 at the same location as shown in FIG. 3. Otherwise, FIG. 4 corresponds to FIG. 3, and the same reference numerals have been used as appropriate. The RF multiplier part includes a first pair of transistors 30, 40 whose first main electrodes, e.g. source terminals are coupled together and coupled to one of the two balanced outputs of the baseband part. A balanced local oscillator signal drives the gates of the first pair of transistors. A second pair of transistors 50, 60 is coupled to be driven by the other balanced input from the baseband part. Again, the first main electrodes, e.g. source terminals of these transistors are coupled together. The other main electrodes, e.g. drain terminals of transistors 40 and 60 are coupled to power supply line VDD through a load. The load can be of any type, a resistor is shown as an example. The other main electrodes, e.g. the drain terminals of transistors 30 and 50 are coupled together and coupled to the same power line through another load such as a resistor. The differential output of this amplifier is switched by the local oscillator signal alternately to each of the differential RF outputs. This essentially achieves a multiplication of the BB by +/−1 at the LO frequency.

The baseband part can be implemented in various ways. In the example shown, the baseband input is a balanced signal driving the gates of a pair of transistors 70, 80. These form a long-tail differential pair for amplifying the RF input to the mixer. The source terminals are coupled together through resistors, to a current source $I_{DC}$, which provides a biased current. The RF output is taken from the drain terminals of the RF part transistors.

Transistors 70 and 80 of the baseband part are preferably MOS transistors, e.g. made in CMOS technology. Transistors 30, 40, 50, 60 of the multiplication part are preferably MOS transistors, e.g. made in CMOS technology. The suppression means 15 of FIG. 3 is coupled to the node between the baseband amplification part 10 of FIG. 3 and the multiplication part 10 of FIG. 3 and is represented by capacitors 90, 95 in FIG. 4. The MOS transistors of the multiplication part are nMOS transistors. The suppressor means may then be connected to the VDD power line. The suppressing means may be coupled to a VSS power line and the MOS transistors of the suppression means may be pMOS transistors.

FIG. 5 shows how the mixer can be applied in a transceiver 100 for use in equipment such as consumer equipment such as computers, mobile phones, or any kind of consumer electronics equipment 105 having a need for up-conversion. This can include wireless interfaces such as Bluetooth or cellular telephone wireless interfaces, or wireline interfaces such as cable modems for example. The transceiver has an antenna 115, and a circuit 160 for amplifying and separating transmit and receive broadcast signals to and from the antenna. An I-Q mixer for up conversion takes baseband I and Q signals from the transmit circuitry 110, and uses I and Q inputs from the LO 130 to generate transmit RF signals. It comprises an in phase mixer 150 and a quadrature mixer 140. Their outputs are combined at part 165 and fed to the circuit 160. The I and Q mixers can be implemented as a single device following established practice. Down convert mixer 145 takes received RF from the circuit 160 and uses the LO signal to generate LF receive signals which are passed to the receive circuitry 120.

The transmit circuitry can include a phase shifter for giving a phase shift between the baseband I and Q signals. This phase shift compensates for both amplitude and phase errors in the LO and BB I and Q signal paths. If the theoretically required values are used for the amount of phase offset on the baseband signal, a considerable image component normally remains in practice. This is caused by the combination of the intrinsic non-linearity of the mixer and the phase offset on the baseband signal. This unwanted image component can be reduced by using the additional impedance of the invention set out above, since the non linear components at the image frequency are strongly reduced.

From the above, the skilled person will appreciate certain aspects of the present invention. An up conversion mixer having a Gilbert cell arrangement is described including an input amplification part (BB) for producing an amplified signal coupled to a multiplication part (RF), the multiplication part being arranged to multiply the amplified signal by a local oscillator signal (LO) and output a mixed signal, the mixer also having a means, e.g. an impedance such as one or more circuit elements, especially a capacitor, coupled from a node between the input amplification part and the multiplication part, to a power supply line, for suppressing unwanted high frequency in band signal components in the output signal. The linearity of such mixers can be improved considerably by this impedance on the source node of the switch transistors. This suppressing means can be placed to either VSS or to VDD. Notably this improvement can be achieved with low power consumption since no additional power is needed for the increased performance, e.g. when a capacitor is used. Other variations can be conceived and are intended to be within the scope of the claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A mixer, having an input amplification part for producing an amplified signal coupled to a multiplication part, the multiplication part being arranged to multiply the amplified signal by a local oscillator signal and output a mixed signal, the mixer also having means for suppressing coupled from a node between the input amplification part and the multiplication part, to a power supply line, the suppressing means suppressing frequency components at the node to thereby suppress unwanted high-frequency in band output signal components of the multiplication part, the unwanted high-frequency in band output signal components being products of the local oscillator signal with harmonics of the baseband signal.

2. The mixer according to claim 1, wherein the suppressing means improves the in-band linearity of the multiplication part.

3. The mixer according to claim 1, wherein the means is an impedance.

4. The mixer of claim 3, wherein the impedance is a capacitor.

5. The mixer of claim 1, wherein the multiplication part comprises MOS transistors.

6. The mixer of claim 1, wherein the multiplier part is arranged in a balanced differential form.

7. The mixer of claim 1, wherein the mixer is arranged as a Gilbert cell.

8. The mixer of claim 1, wherein the suppressing means is coupled to a VDD power supply line.

9. The mixer of claim 5, wherein the MOS transistors are nMOS transistors.

10. The mixer of claim 5, wherein the suppressing means is coupled to a VSS power line and the MOS transistors being pMOS transistors.

11. The mixer of claim 1 having phase compensation for mirror suppression.

12. The mixer of claim 1 in the form of an integrated circuit.

13. The mixer of claim 1 wherein the unwanted high-frequency in band output signal components are the frequency of the local oscillator signal +/−3 times the frequency of the baseband signal.

14. A wireless or wireline transceiver having the mixer of claim 1.

15. The transceiver of claim 14, comprising in a transmit path a mixer for an in-phase signal, and a mixer for a quadrature phase signal.

16. A method of producing up converted signals using a mixer, the mixer comprising a node between an input amplification part and a multiplication part of the mixer, the method comprising:
   amplifying an input baseband signal to the mixer,
   multiplying the amplified signal by a local oscillator signal, outputting a mixed signal, and
   suppressing one or more unwanted high frequency signal components of an output signal of the multiplication part, the unwanted high-frequency in band output signal components being products of the local oscillator signal with harmonics of the baseband signal.

17. The method according to claim 16, wherein suppressing improves the in-band linearity of the multiplication part.

18. The method of claim 16, wherein multiplying is in a balanced differential form.

19. The method of claim 16 having phase compensation for mirror suppression.

20. The method of claim 16 wherein the unwanted high-frequency in band output signal components are the frequency of the local oscillator signal +/−3 times the frequency of the baseband signal.

* * * * *